US012718765B2

(12) United States Patent
Choi et al.

(10) Patent No.: US 12,718,765 B2
(45) Date of Patent: Aug. 25, 2026

(54) DISPLAY DEVICE AND DRIVING METHOD FOR ADJUSTING RESET VOLTAGE OR SENSING PATTERN LUMINANCE ACCORDING TO SENSOR DEGRADATION

(71) Applicant: SAMSUNG DISPLAY CO., LTD., Yongin-si (KR)

(72) Inventors: Min Soo Choi, Yongin-si (KR); Jin Soo Jung, Yongin-si (KR); Soung Wook Kim, Yongin-si (KR); Seok Gyu Yoon, Yongin-si (KR); Byung Seok Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 30 days.

(21) Appl. No.: 18/545,524

(22) Filed: Dec. 19, 2023

(65) Prior Publication Data

US 2024/0395215 A1 Nov. 28, 2024

(30) Foreign Application Priority Data

Mar. 24, 2023 (KR) ........................ 10-2023-0038566

(51) Int. Cl.
*G09G 3/3266* (2016.01)
*G02F 1/1333* (2006.01)
(Continued)

(52) U.S. Cl.
CPC ....... *G09G 3/3266* (2013.01); *G02F 1/13338* (2013.01); *G06F 3/0412* (2013.01);
(Continued)

(58) Field of Classification Search
CPC ........... G09G 3/006; G09G 3/30–3291; G09G 2300/0439; G09G 2310/0267;
(Continued)

(56) References Cited

U.S. PATENT DOCUMENTS 11,074,862 B2 7/2021 Bae et al.
2010/0066713 A1* 3/2010 Katsu ..................... H05B 45/20 345/207
(Continued)

FOREIGN PATENT DOCUMENTS

KR 10-2017-0136028 12/2017
KR 10-2020-0048467 5/2020
(Continued)

*Primary Examiner* — Keith L Crawley
(74) *Attorney, Agent, or Firm* — F. CHAU & ASSOCIATES, LLC

(57) ABSTRACT

A display device includes a plurality of pixels in which pixels located in a selected area emit light in a sensing pattern; a plurality of optical sensors generating sensing signals corresponding to the amount of light received; and a circuit determining amounts of deterioration of the plurality of optical sensors based on the sensing signals. The circuit determines a current deterioration degree based on the amounts, sets a light emitting luminance of the sensing pattern to a first value based on the current deterioration degree, and the first value is larger than a second value associated with a previous deterioration degree when the current deterioration degree is greater than the previous deterioration degree.

20 Claims, 12 Drawing Sheets

(51) Int. Cl.
*G06F 3/041* (2006.01)
*G09G 3/32* (2016.01)
*H10K 59/40* (2023.01)

(52) U.S. Cl.
CPC ............... *G09G 3/32* (2013.01); *H10K 59/40* (2023.02); *G09G 2300/0439* (2013.01); *G09G 2310/0267* (2013.01); *G09G 2310/061* (2013.01)

(58) Field of Classification Search
CPC . G09G 2310/061–063; G09G 2330/12; G09G 2360/14–148; G06F 3/0412; G06F 3/042–0421; H10K 39/32–34; H10K 59/13; H10K 59/40; H10K 59/60–65; G02F 1/13338; G06V 10/12–141; G06V 40/12–1318; H05B 45/10–12
See application file for complete search history.

(56) References Cited

U.S. PATENT DOCUMENTS

2011/0109592 A1* 5/2011 Kurokawa ............ H10F 39/184 345/175
2011/0242075 A1* 10/2011 Yamamoto ............ G06F 3/0412 250/208.6
2012/0074474 A1* 3/2012 Kitagawa ................ H10F 39/18 257/E31.124
2012/0162064 A1* 6/2012 Hata ..................... G06F 3/0421 250/206.1
2015/0243217 A1* 8/2015 Park ..................... G09G 3/3258 345/76
2017/0214878 A1* 7/2017 Van Der Tempel ... H04N 25/59
2019/0019048 A1* 1/2019 Deng ...................... G06F 3/041
2019/0180075 A1* 6/2019 Kim .................. G06V 40/1312
2019/0370526 A1* 12/2019 Wang .............. G06Q 20/40145
2020/0321387 A1* 10/2020 Jang .................... H10F 39/8037
2022/0058362 A1* 2/2022 Lee ........................ G06V 40/13
2022/0090962 A1* 3/2022 Lee ........................... G01J 1/44
2022/0147730 A1* 5/2022 Kim .................. G06V 40/1365
2022/0165834 A1* 5/2022 Jo .......................... H10K 59/60
2022/0208044 A1 6/2022 Lee
2022/0359628 A1 11/2022 Choi et al.
2023/0408867 A1* 12/2023 Steckel .................. H05B 45/22
2024/0206201 A1* 6/2024 Saito .................... G06V 10/141

FOREIGN PATENT DOCUMENTS

KR 10-2021-0024274 3/2021
KR 10-2022-0092013 7/2022

* cited by examiner

DISPLAY DEVICE AND DRIVING METHOD FOR ADJUSTING RESET VOLTAGE OR SENSING PATTERN LUMINANCE ACCORDING TO SENSOR DEGRADATION

CROSS-REFERENCE TO RELATED APPLICATION

This U.S. patent application claims priority under 35 U.S.C. § 119 to Korean Patent Application No. 10-2023-0038566, filed on Mar. 24, 2023, the disclosure of which is incorporated by reference in its entirety herein.

TECHNICAL FIELD

The present invention relates to a display device and a driving method thereof.

DISCUSSION

A display device is used as a connection medium between a user and information. Examples of the display device include a liquid crystal display device and an organic light emitting display device. The display device may include a touchscreen to enable a user to provide an input to the display device. The touch screen may include a plurality of optical sensors for sensing the input. An optical sensor is an electronic detector that converts light into an electrical signal.

The display device may perform a function of authenticating a user by sensing a user's fingerprint using the plurality of optical sensors. However, when the optical sensors become deteriorated, the function of authenticating a user may not be properly performed because a fingerprint image is not clearly generated.

SUMMARY

At least one embodiment provides a display device capable of compensating for deterioration of optical sensors and a driving method thereof.

A display device according to an embodiment of the present invention include a plurality of pixels in which pixels located in a selected area emit light in a sensing pattern; a plurality of optical sensors generating sensing signals corresponding to an amount of light received; and a circuit determining amounts of deterioration of the plurality of optical sensors based on the sensing signals. The circuit determines a current deterioration degree based on the amounts, sets a light emitting luminance of the sensing pattern to a first value based on the current deterioration degree, and the first value is larger than a second value associated with a previous deterioration degree when the current deterioration degree is greater than the previous deterioration degree. For example, as the deterioration degrees of the optical sensors located in the selected area among the plurality of optical sensors increase, the light emitting luminance of the sensing pattern may increase.

When a partial area of the plurality of pixels is selected while the plurality of pixels display an image, an image portion corresponding to the selected area may be changed to the sensing pattern, and the remaining image portion may maintain the image.

The display device may further include a touch sensor sensing the selected area, and an area of a sensor electrode included in the touch sensor may be larger than an area of one of the pixels or an area of one of the optical sensors.

The plurality of optical sensors may include a first optical sensor including a first photodiode, where a first reset voltage is applied to an anode of the first photodiode during a reset period; and a second optical sensor including a second photodiode, where a second reset voltage is applied to an anode of the second photodiode during the reset period. A magnitude of the first reset voltage and a magnitude of the second reset voltage may be different from each other.

When a deterioration degree of the first optical sensor is greater than a deterioration degree of the second optical sensor, a difference between the first reset voltage and a cathode voltage of the first photodiode may be set to be greater than a difference between the second reset voltage and a cathode voltage of the second photodiode.

The first optical sensor may further include a first sensing transistor having a gate electrode connected to a first node, a first electrode connected to a common voltage line, and a second electrode connected to a second node; a second sensing transistor having a gate electrode connected to a first scan line, a first electrode connected to the second node, and a second electrode connected to a readout line; and a third sensing transistor having a gate electrode connected to a reset line, a first electrode receiving the first reset voltage, and a second electrode connected to the first node.

Some of the plurality of pixels may be connected to the first scan line.

A display device according to an embodiment of the present invention includes a plurality of pixels in which pixels located in a selected area emit light as a sensing pattern; a plurality of optical sensors generating sensing signals corresponding to an amount of light received; and a circuit determining deterioration degrees of the plurality of optical sensors based on the sensing signals. Each of the plurality of optical sensors include a photodiode. The circuit sets a reset voltage for each of the optical sensors based on the corresponding deterioration degrees and applies each reset voltage to an anode of the photodiode of the corresponding optical sensors, during a reset period.

The plurality of optical sensors may include a first optical sensor including a first photodiode, where a first reset voltage is applied to an anode of the first photodiode during the reset period; and a second optical sensor including a second photodiode, where a second reset voltage is applied to an anode of the second photodiode during the reset period. A magnitude of the first reset voltage and a magnitude of the second reset voltage may be different from each other.

When a deterioration degree of the first optical sensor is greater than a deterioration degree of the second optical sensor, a difference between the first reset voltage and a cathode voltage of the first photodiode may be set to be greater than a difference between the second reset voltage and a cathode voltage of the second photodiode.

The reset period of the first optical sensor and the reset period of the second optical sensor may be the same.

The first optical sensor may further include a first sensing transistor having a gate electrode connected to a first node, a first electrode connected to a common voltage line, and a second electrode connected to a second node; a second sensing transistor having a gate electrode connected to a first scan line, a first electrode connected to the second node, and a second electrode connected to a readout line; and a third sensing transistor having a gate electrode connected to a reset line, a first electrode receiving the first reset voltage, and a second electrode connected to the first node.

Some of the plurality of pixels may be connected to the first scan line.

A method of driving a display device according to an embodiment of the present invention includes selecting a partial area of a plurality of pixels; emitting light in a sensing pattern by pixels located in a selected area; generating sensing signals corresponding to an amount of light received by a plurality of optical sensors; determining a current deterioration degree based on the amounts; setting a light emitting luminance of the sensing pattern to a first value based on the current deterioration degree. The first value is larger than a second value associated with a previous deterioration degree when the current deterioration degree is greater than the previous deterioration degree.

When the partial area of the plurality of pixels is selected while the plurality of pixels display an image, an image portion corresponding to the selected area may be changed to the sensing pattern, and the remaining image portion may maintain the image.

A method of driving a display device according to an embodiment of the present invention includes selecting a partial area of a plurality of pixels; emitting light in a sensing pattern by pixels located in a selected area; generating sensing signals corresponding to an amount of light received by a plurality of optical sensors; determining deterioration degrees of the plurality of optical sensors based on the sensing signals, where each of the plurality of optical sensors include a photodiode; setting a reset voltage for each of the optical sensors based on the corresponding deterioration degrees; and applying each reset voltage to an anode of the photodiode of the corresponding optical sensors, during a reset period.

The plurality of optical sensors may include a first optical sensor including a first photodiode and the method may include applying a first reset voltage to an anode of the first photodiode during the reset period; and a second optical sensor including a second photodiode and the method May include applying a second reset voltage to an anode of the second photodiode during the reset period. A magnitude of the first reset voltage and a magnitude of the second reset voltage may be different from each other.

When a deterioration degree of the first optical sensor is greater than a deterioration degree of the second optical sensor, a difference between the first reset voltage and a cathode voltage of the first photodiode may be set to be greater than a difference between the second reset voltage and a cathode voltage of the second photodiode.

The reset period of the first optical sensor and the reset period of the second optical sensor may be the same.

The first optical sensor may further include a first sensing transistor having a gate electrode connected to a first node, a first electrode connected to a common voltage line, and a second electrode connected to a second node; a second sensing transistor having a gate electrode connected to a first scan line, a first electrode connected to the second node, and a second electrode connected to a readout line; and a third sensing transistor having a gate electrode connected to a reset line, a first electrode receiving the first reset voltage, and a second electrode connected to the first node.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts.

DETAILED DESCRIPTION

Figure 1:
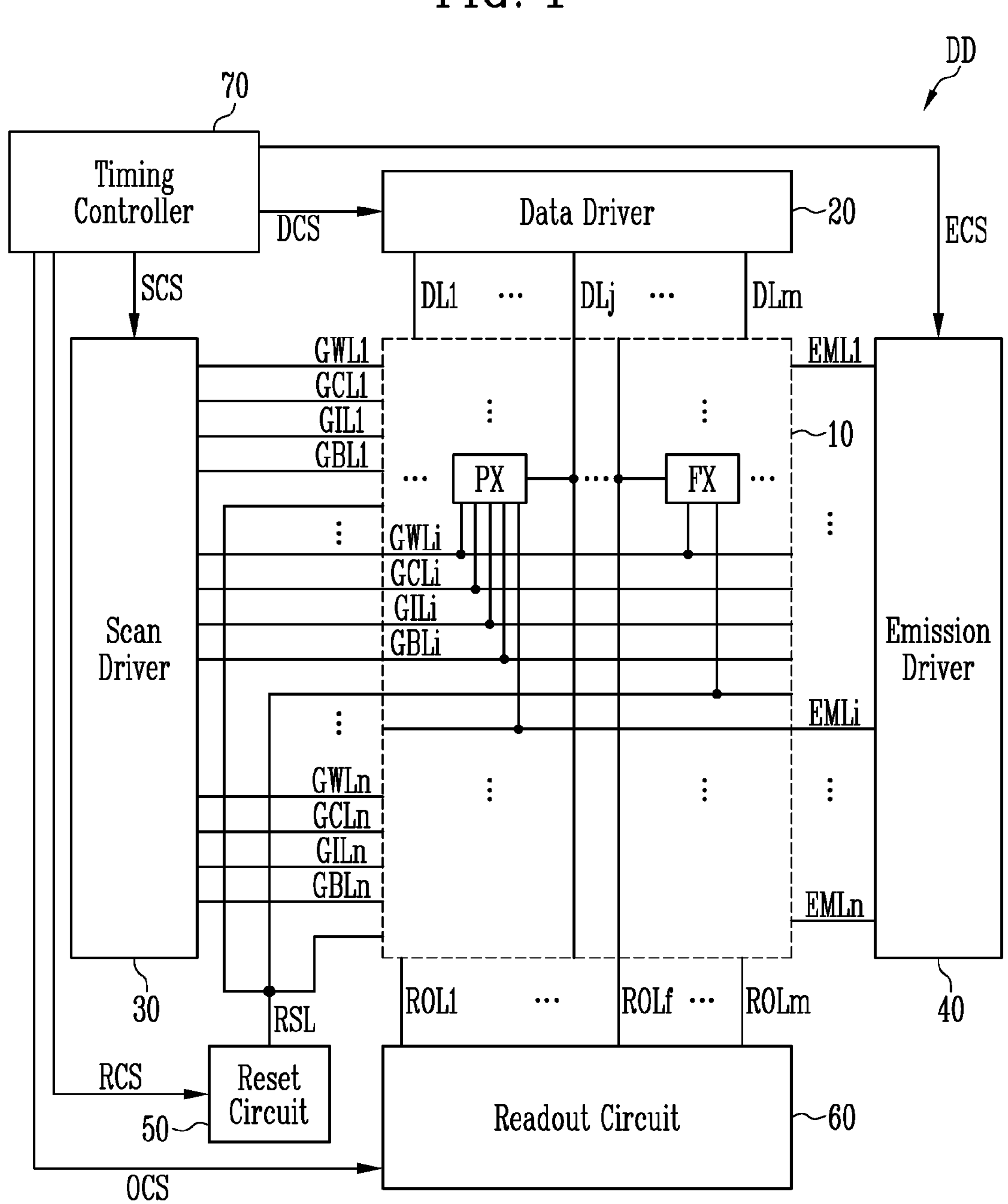
FIG. 1 is a diagram for explaining a display device according to an embodiment of the present invention.

Hereinafter, various embodiments of the present invention will be described in detail with reference to the accompanying drawings so that those of ordinary skill in the art may implement the present invention. The present invention may be embodied in various different forms and is not limited to the embodiments described herein.

In order to clearly describe the present invention, parts that are not related to the description may be omitted, and the same or similar components are denoted by the same reference numerals throughout the specification. Therefore, the reference numerals described above may also be used in other drawings.

In addition, the size and thickness of each component shown in the drawings are shown for convenience of description, and thus the present invention is not necessarily limited to those shown in the drawings. In the drawings, thicknesses may be exaggerated to clearly express the layers and regions.

In addition, in the description, the expression "is the same" may mean "substantially the same". That is, it may be the same enough to convince those of ordinary skill in the art to be the same. In other expressions, "substantially" may be omitted.

FIG. 1 is a diagram for explaining a display device according to an embodiment of the present invention.

Referring to FIG. 1, a display device DD according to an embodiment of the present invention includes a display panel 10, a data driver 20 (e.g., a driver circuit), a scan driver 30 (e.g., driver circuit), an emission driver 40 (e.g., a driver circuit), a reset circuit 50, a readout circuit 60, and a timing controller 70 (e.g., a controller circuit).

The timing controller 70 may receive grayscales and timing signals for each frame period from a processor. Here, the processor may correspond to at least one of a graphics processing unit (GPU), a central processing unit (CPU), an application processor (AP), and the like. The timing signals may include a vertical synchronization signal, a horizontal synchronization signal, a data enable signal, and the like.

Each cycle of the vertical synchronization signal may correspond to each frame period. Each cycle of the horizontal synchronization signal may correspond to each horizontal period. The grayscales may be supplied in units of horizontal lines in each horizontal period in response to an enable level pulse of the data enable signal. A horizontal line may refer to pixels (for example, a pixel row) connected to the same scan line and emission line.

The timing controller 70 may generate a first control signal SCS, a second control signal ECS, a third control signal DCS, a fourth control signal RCS, and a fifth control signal OCS based on the received grayscales and timing signals. The first control signal SCS may be supplied to the scan driver 30, the second control signal ECS may be supplied to the emission driver 40, the third control signal DCS may be supplied to the data driver 20, the fourth control signal RCS may be supplied to the reset circuit 50, and the fifth control signal OCS may be supplied to the readout circuit 60. The timing controller 70 may rearrange (for example, render) and correct the grayscales, and supply them to the data driver 20.

The display panel 10 may include pixels PX connected to data lines DL1, . . . , DLj, . . . , and DLm, scan lines GWL1, . . . , GWLi, . . . , GWLn, GCL1, . . . , GCLi, . . . , GCLn, GIL1, . . . , GILi, . . . , GILn, GBL1, . . . , GBLi, . . . , and GBLn, and emission lines EML1, . . . , EMLi, . . . , and EMLn. In addition, the display panel 10 may include optical sensors FX connected to first scan lines GWL1, . . . , GWLi, . . . , and GWLn, a reset line RSL, and readout lines ROL1, . . . , ROLf, . . . , and ROLm. Here, m and n may be integers greater than 1. The pixels PX may include light emitting elements, and the optical sensors FX may include light receiving elements. For example, all pixel rows of the display panel 10 may receive image data based on the corrected greyscales during the frame period and one of the pixel rows may receive a part of the image data during the horizontal period.

The data driver 20 may receive the grayscales and the third control signal DCS from the timing controller 70. For example, the third control signal DCS may include a source start signal, a clock signal, and the like. For example, the data driver 20 may sample the grayscales while shifting the source start signal based on the clock signal, and apply data voltages corresponding to the sampled grayscales to the data lines DL1 to DLm in units of pixel rows.

The scan driver 30 may receive the first control signal SCS from the timing controller 70. The first control signal SCS may include a clock signal, a scan start signal, and the like. The scan driver 30 may supply scan signals to the scan lines GWL1, . . . , GWLi, . . . , GWLn, GCL1, . . . , GCLi, . . . , GCLn, GIL1, . . . , GILi, . . . , GILn, GBL1, . . . , GBLi, . . . , and GBLn in response to the first control signal SCS.

FIG. 1 shows an embodiment in which the scan lines GWL1, . . . , GWLi, . . . , GWLn, GCL1, . . . , GCLi, . . . , GCLn, GIL1, . . . , GILi, . . . , GILn, GBL1, . . . , GBLi, . . . , and GBLn are connected to one scan driver 30, but embodiments of the present invention are not limited thereto. For example, the scan driver 30 may include a first sub-scan driver connected to first scan lines GWL1, . . . , GWLi, . . . , and GWLn, a second sub-scan driver connected to second scan lines GCL1, . . . , GCLi, . . . , and GCLn, a third sub-scan driver connected to third scan lines GIL1, . . . , GILi, . . . , and GILn, and a fourth sub-scan driver connected to fourth scan lines GBL1, . . . , GBLi, . . . , and GBLn. In another example, the scan driver 30 may be configured to include a first sub-scan driver connected to scan lines GWL1, . . . , GWLi, . . . , GWLn, GBL1, . . . , GBLi, . . . , and GBLn and a second sub-scan driver connected to scan lines GCL1, . . . , GCLi, . . . , GCLn, GIL1, . . . , GILi, . . . , and GILn.

The scan driver 30 or each sub-scan driver may sequentially supply the scan signals having turn-on level pulses to corresponding scan lines. The scan driver 30 or each sub-scan driver may include scan stages configured in the form of a shift register. The scan driver 30 or each sub-scan driver may generate the scan signals by sequentially transferring the scan start signal in the form of a turn-on level pulse to a next scan stage under the control of the clock signal.

The emission driver 40 may receive the second control signal ECS from the timing controller 70. The second control signal ECS may include a clock signal, an emission stop signal, and the like. The emission driver 40 may supply emission signals to the emission lines EML1 to EMLn in response to the second control signal ECS.

The emission driver 40 may sequentially supply the emission signals having turn-off level pulses to the emission lines EML1 to EMLn. The emission driver 40 may include emission stages configured in the form of a shift register. The emission driver 40 may generate the emission signals by sequentially transferring the emission stop signal in the form of a turn-off level pulse to a next emission stage under the control of the clock signal.

FIG. 1 shows an embodiment in which the scan driver 30 and the emission driver 40 are provided as separate components, but embodiments of the present invention are not limited thereto. For example, the scan driver 30 and the emission driver 40 may be integrated into a single driving circuit or a single module.

The reset circuit 50 may receive the fourth control signal RCS from the timing controller 70. The reset circuit 50 may apply a reset signal to the reset line RSL in response to the fourth control signal RCS. In an embodiment, the reset line RSL is commonly connected to all the optical sensors FX of the display panel 10. Meanwhile, in another embodiment, the reset circuit 50 may be connected to a plurality of optical sensors FX through a plurality of reset 10) lines.

The readout circuit 60 may receive the fifth control signal OCS from the timing controller 70. The readout circuit 60 may provide sensing information based on sensing signals received from the readout lines ROL1 to ROLm in response to the fifth control signal OCS. For example, the sensing information may correspond to a fingerprint image.

The processor or timing controller 70 may perform a function of authenticating a user using the sensing information provided from the readout circuit 60.

Figure 2:
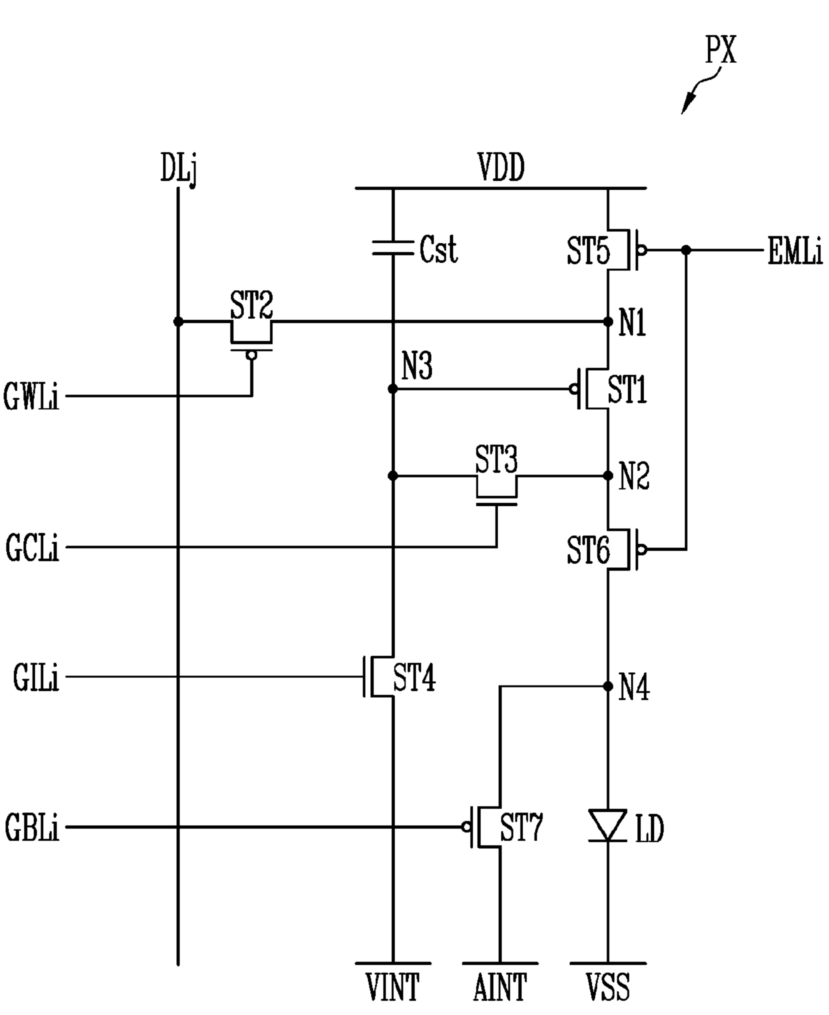
FIG. 2 is a diagram for explaining a pixel of the display device according to an embodiment of the present invention.

FIG. 2 is a diagram for explaining a pixel of the display panel 10 according to an embodiment of the present invention.

FIG. 2 shows a pixel PX disposed in an i-th pixel row and a j-th pixel column among a plurality of pixels PX of the display panel 10 as an example. A pixel row may refer to pixels connected to the same scan line and emission line, and a pixel column may refer to pixels connected to the same data line. Here, i may be an integer greater than or equal to 1 and less than or equal to n, and j may be an integer greater than or equal to 1 and less than or equal to m.

Referring to FIG. 2, the pixel PX may include pixel transistors ST1 to ST7, a light emitting element LD, and a storage capacitor Cst, but the present invention is not limited thereto.

A first electrode of a first pixel transistor ST1 (driving transistor) may be connected to a first node N1, a second electrode of the first pixel transistor ST1 may be connected to a second node N2, and a gate electrode of the first pixel transistor ST1 may be connected to a third node N3. The first pixel transistor ST1 may control a driving current flowing from a first power source voltage VDD to a second power source voltage VSS via the light emitting element LD in response to a voltage of the third node N3. A level of the first power source voltage VDD may be higher than a level of the second power source voltage VSS.

A first electrode of a second pixel transistor ST2 (switching transistor) may be connected to a data line DLj, a second electrode of the second pixel transistor ST2 may be connected to the first node N1, and a gate electrode of the second pixel transistor ST2 may be connected to a first scan line GWLi. The second pixel transistor ST2 may be turned on when a first scan signal of a turn-on level is supplied to the first scan line GWLi to electrically connect the data line DLj and the first electrode of the first pixel transistor ST1.

A first electrode of a third pixel transistor ST3 (diode-connected transistor) may be connected to the second node N2, a second electrode of the third pixel transistor ST3 may be connected to the third node N3, and a gate electrode of the third pixel transistor ST3 may be connected to a second scan line GCLi. The third pixel transistor ST3 may be turned on when a second scan signal of a turn-on level is supplied to the second scan line GCLi to electrically connect the second electrode of the first pixel transistor ST1 and the third node N3. That is, when the third pixel transistor ST3 is turned on, the first pixel transistor ST1 may be connected in a diode form.

A first electrode of a fourth pixel transistor ST4 (gate initialization transistor) may be connected to the third node N3, a second electrode of the fourth pixel transistor ST4 may be connected to a first initialization voltage line to which a first initialization voltage VINT is applied, and a gate electrode of the fourth pixel transistor ST4 may be connected to a third scan line GILi. The fourth pixel transistor ST4 may be turned on when a third scan signal GI[i] of a turn-on level is supplied to the third scan line GILi to supply the first initialization voltage VINT to the third node N3.

A first electrode of a fifth pixel transistor ST5 (first emission transistor) may be connected to a first power source line to which the first power source voltage VDD is applied, a second electrode of the fifth pixel transistor ST5 may be connected to the first node N1, and a gate electrode of the fifth pixel transistor ST5 may be connected to an emission line EMLi. The fifth pixel transistor ST5 may be turned off when an emission signal of a turn-off level is supplied to the emission line EMLi, and may be turned on in other cases.

A first electrode of a sixth pixel transistor ST6 (second emission transistor) may be connected to the second node N2, a second electrode of the sixth pixel transistor ST6 may be connected to a fourth node N4, and a gate electrode of the sixth pixel transistor ST6 may be connected to the emission line EMLi. The sixth pixel transistor ST6 may be turned off when the emission signal of the turn-off level is supplied to the emission line EMLi, and may be turned on in other cases.

A first electrode of a seventh pixel transistor ST7 (anode initialization transistor) may be connected to the fourth node N4, a second electrode of the seventh pixel transistor ST7 may be connected to a second initialization voltage line to which a second initialization voltage AINT is applied, and a gate electrode of the seventh pixel transistor ST7 may be connected to a fourth scan line GBLi. The seventh pixel transistor ST7 may be turned on when a fourth scan signal of a turn-on level is supplied to the fourth scan line GBLi to supply the second initialization voltage AINT to the fourth node N4.

Among the pixel transistors ST1 to ST7, some transistors ST1, ST2, ST5, ST6, and ST7 may be P-type transistors, and other transistors ST3 and ST4 may be N-type transistors, but embodiments of the present invention are not limited thereto. For example, each of the pixel transistors ST1 to ST7 may be a P-type transistor or an N-type transistor.

A first electrode of the storage capacitor Cst may be connected to a first power source line to which the first power source voltage VDD is applied, and a second electrode of the storage capacitor Cst may be connected to the third node N3.

An anode of the light emitting element LD may be connected to the fourth node N4 and a cathode of the light emitting element LD may be connected to the second power source line to which the second power source voltage VSS is applied. The light emitting element LD may be a light emitting diode. The light emitting element LD may be an organic light emitting diode, an inorganic light emitting diode, a quantum dot/well light emitting diode, or the like. The light emitting element LD may emit light of any one of a first color, a second color, and a third color. While FIG. 2 illustrates that only one light emitting element LD is provided in each pixel, a plurality of light emitting elements may be provided in each pixel in another embodiment. In this case, the plurality of light emitting elements may be connected in series, in parallel, or in series and parallel.

Figure 3:
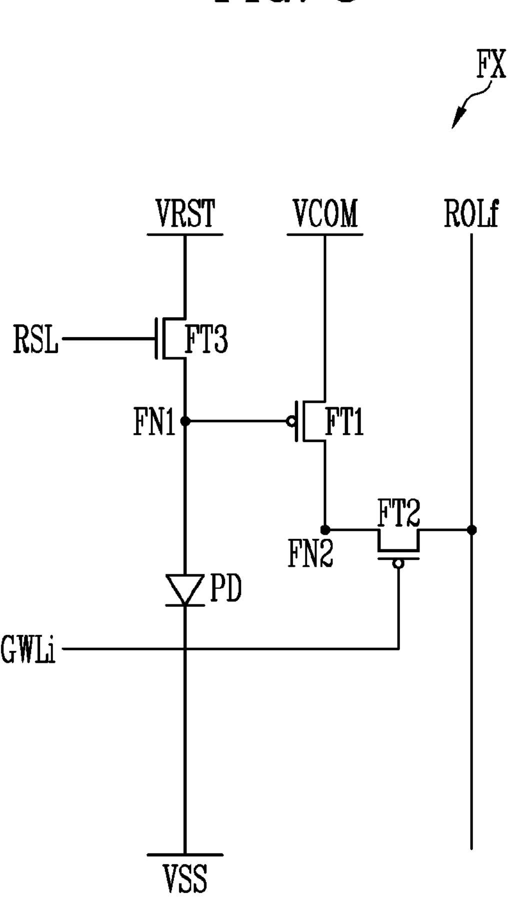
FIG. 3 is a diagram for explaining an optical sensor of the display device according to an embodiment of the present invention.

FIG. 3 is a diagram for explaining an optical sensor according to an embodiment of the present invention.

Referring to FIG. 3, an optical sensor FX of the display panel 10 may include sensing transistors FT1 to FT3 and a light receiving element PD, but embodiments of the present invention are not limited thereto.

A first electrode of a first sensing transistor FT1 (amplification transistor) may be connected to a common voltage line to which a common voltage VCOM is applied, a second electrode of the first sensing transistor FT1 may be connected to a second node FN2, and a gate electrode of the first sensing transistor FT1 may be connected to a first node FN1. The first sensing transistor FT1 may control a sensing current flowing through the first sensing transistor FT1 in response to a voltage of the first node FN1. The sensing current may be supplied to a readout line ROLf via a second sensing transistor FT2 as a sensing signal.

A first electrode of the second sensing transistor FT2 (output transistor) may be connected to the second node FN2, a second electrode of the second sensing transistor FT2 may be connected to the readout line ROLf, and a gate electrode of the second sensing transistor FT2 may be connected to the first scan line GWLi. That is, the same scan line, that is, the first scan line GWLi, may be connected to the gate electrode of the second sensing transistor FT2 and the gate electrode of the second pixel transistor ST2. The second sensing transistor FT2 may be turned on when the first scan signal of the turn-on level is supplied to the first scan line GWLi to electrically connect the second electrode of the first sensing transistor FT1 and the readout line ROLf.

A first electrode of a third sensing transistor FT3 (reset transistor) may be connected to a reset voltage line to which the reset voltage VRST is applied, a second electrode of the third sensing transistor FT3 may be connected to the first node FN1, and a gate electrode of the third sensing transistor FT3 may be connected to the reset line RSL. The third sensing transistor FT3 may be turned on when the reset signal of a turn-on level is supplied to the reset line RSL to supply the reset voltage VRST to the first node FN1. The first node FN1, that is, the gate electrode of the first sensing transistor FT1 may be reset by the reset voltage VRST. The reset voltage VRST may be set lower than the second power source voltage VSS.

Among the sensing transistors FT1 to FT3, some transistors FT1 and FT2 of may be P-type transistors, and the other transistor FT3 may be N-type transistor, but embodiments of the present invention are not limited thereto. For example, each of the sensing transistors FT1 to FT3 may be a P-type transistor or an N-type transistor.

A first electrode (or anode) of the light receiving element PD may be connected to the first node FN1, and a second electrode (or cathode) of the light receiving element PD may be connected to the second power source line to which the second power source voltage VSS is applied. The light receiving element PD may be a photo diode. However, in another embodiment, the light receiving element PD may be a photo transistor. When the light receiving element PD receives light, electrons are excited, and a reverse current may flow from a cathode of the light receiving element PD to an anode of the light receiving element PD. Accordingly, when the light receiving element PD is exposed to light, the voltage of the first node FN1 may gradually increase after a reset time point. As the light receiving time increases or the light intensity increases, the amount of increase in the voltage at the first node FN1 after the reset time point may increase. Therefore, the magnitude of the sensing current flowing through the readout line ROLf may vary according to the light receiving time and the light intensity. For example, the light receiving time may be a time duration when light is received by the light receiving element PD.

Figure 4:
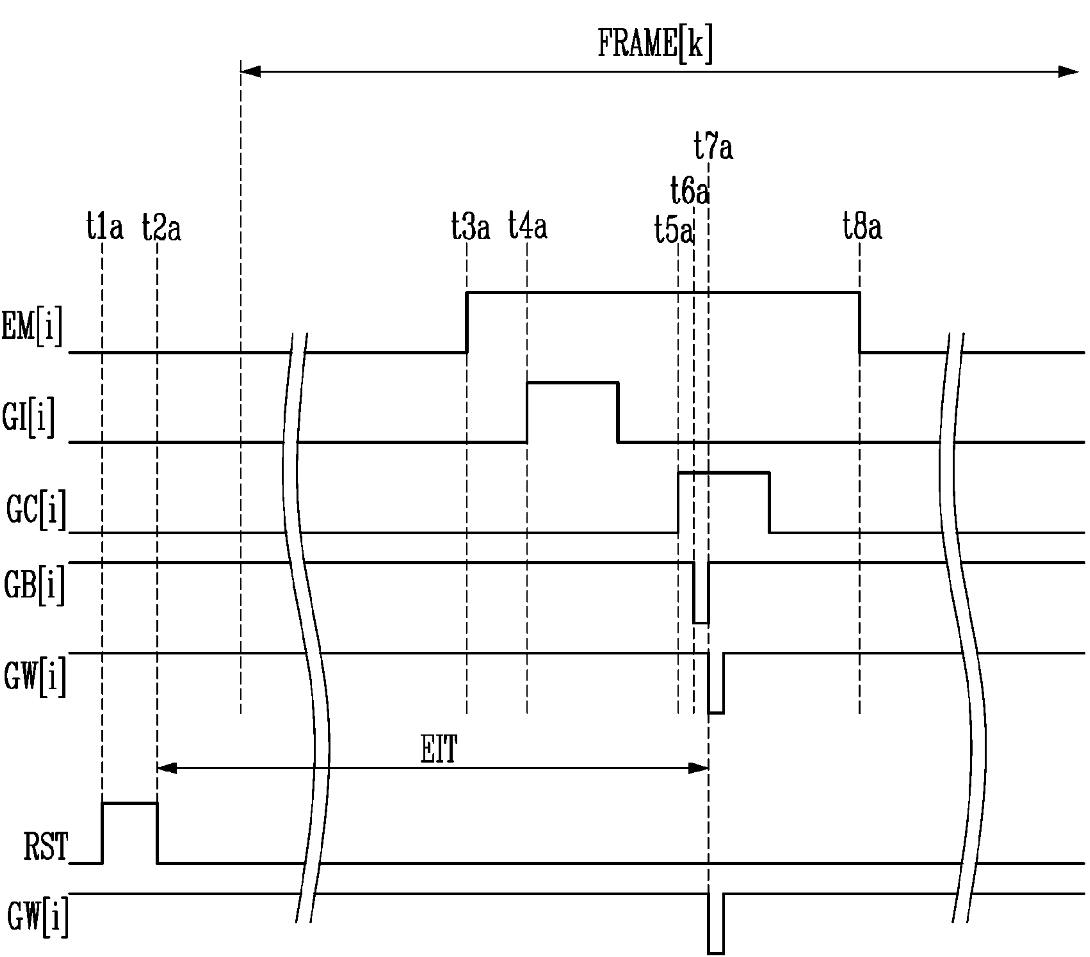
FIG. 4 is a diagram for explaining a method of driving a pixel and an optical sensor of the display device according to an embodiment of the present invention.

FIG. 4 is a diagram for explaining a method of driving a pixel and an optical sensor according to an embodiment of the present invention.

FIG. 4 is a diagram for explaining a process in which the pixel PX of FIG. 2 and the photo sensor FX of FIG. 3 operate in an arbitrary k-th frame period FRAME[k].

First, during a period t1*a* to t2*a* before the k-th frame period FRAME[k], a reset signal RST of a turn-on level is applied to the reset line RSL. Therefore, the first node FN1 of the photo sensor FX may be reset by the reset voltage VRST. After the time point t2*a*, the voltage of the first node FN1 may gradually increase according to a length of a light receiving period EIT during which light is received and a light intensity of the light.

At a time point t3*a*, an emission signal EM[i] of a turn-off level is supplied to the emission line EMLi. Accordingly, the fifth pixel transistor ST5 and the sixth pixel transistor ST6 may be turned off, and the light emitting element LD may be prevented from emitting light.

At a time point t4*a*, the third scan signal GI[i] of the turn-on level is supplied to the third scan line GILi. Accordingly, the fourth pixel transistor ST4 may be turned on, and the third node N3 may be initialized with the first initialization voltage VINT.

At a time point t5*a*, a second scan signal GC[i] of a turn-on level is supplied to the second scan line GCLi. Accordingly, the third pixel transistor ST3 may be turned on, and the first pixel transistor ST1 may be connected in a diode form.

At a time point t6*a*, a fourth scan signal GB[i] of a turn-on level is supplied to the fourth scan line GBLi. Accordingly, the seventh pixel transistor ST7 may be turned on, and the fourth node N4 may be initialized with the second initialization voltage AINT. In an embodiment, the second initialization voltage AINT is set to a voltage equal to or lower than the second power source voltage VSS, so that the light emitting element LD may express a low grayscale.

At a time point t7*a*, a first scan signal GW[i] of a turn-on level is supplied to the first scan line GWLi. Accordingly, the second pixel transistor ST2 may be turned on, and a data voltage may be applied to the first node N1. In this case, the third node N3 may be in a state in which the first initialization voltage VINT is applied, and the first initialization voltage VINT may be a voltage sufficiently lower than the data voltages. Accordingly, the first pixel transistor ST1 may be turned on, and a compensation data voltage in which a decrease in a threshold voltage is reflected in the data voltage may be applied to the third node N3. The storage capacitor Cst may maintain a voltage corresponding to a difference between the first power source voltage VDD and the compensation data voltage. This period may be referred to as a threshold voltage compensation period or a data writing period.

Also, at the time point t7*a*, the second sensing transistor FT2 may be turned on by the first scan signal GW[i] of the turn-on level. Accordingly, a sensing current corresponding to the light receiving period EIT and the light intensity may flow through the readout line ROLf.

At a time point t8*a*, the emission signal EM[i] of a turn-on level is supplied to the emission line EMLi. Accordingly, the fifth pixel transistor ST5 and the sixth pixel transistor ST6 may be turned on, and the light emitting element LD may be in a state capable of emitting light.

In this case, a driving current path connecting the first power source line, the fifth pixel transistor ST5, the first pixel transistor ST1, the sixth pixel transistor ST6, the light emitting element LD, and the second power source line may be formed. The amount of driving current flowing through the first electrode and the second electrode of the first pixel transistor ST1 may be adjusted according to the voltage maintained in the storage capacitor Cst. The light emitting element LD may emit light with a luminance corresponding to the amount of driving current. The light emitting element LD may emit light until the emission signal EM[i] of the turn-off level is applied to the emission line EMLi.

Figure 5:
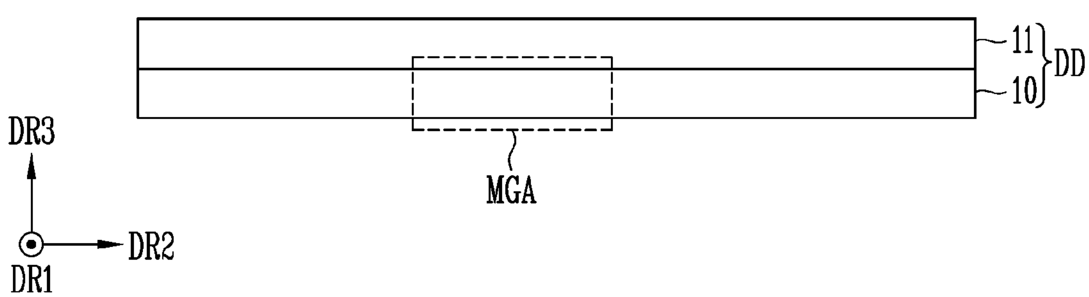
FIG. 5 is a diagram for explaining a stacking relationship between a display panel and a touch sensor of the display device.

FIG. 5 is a diagram for explaining a stacking relationship between a display panel and a touch sensor.

Referring to FIG. 5, the display device DD includes the display panel 10 and a touch sensor 11. The display panel 10 may be a flat-type display panel extending in a first direction DR1 and a second direction DR2. The first direction DR1 and the second direction DR2 may be perpendicular to each other. Similarly, the touch sensor 11 may be a flat-type touch sensor extending in the first direction DR1 and the second direction DR2.

The touch sensor 11 may be positioned in a third direction DR3 of the display panel 10. The third direction DR3 may be perpendicular to the first and second directions DR1 and DR2. The third direction DR3 may be a direction in which an image is displayed on the display panel 10. A user may intuitively control the display device DD by touching the touch sensor 11 while looking at the image in the third direction DR3 of the display panel 10. The touch sensor 11 may be implemented as a mutual-capacitance type touch sensor, a self-capacitance type touch sensor, and the like. According to an embodiment, the display panel 10 and the touch sensor 11 are integrally manufactured. For example, a single process may be used to manufacture the display panel 10 and the touch sensor 11.

Figure 6:
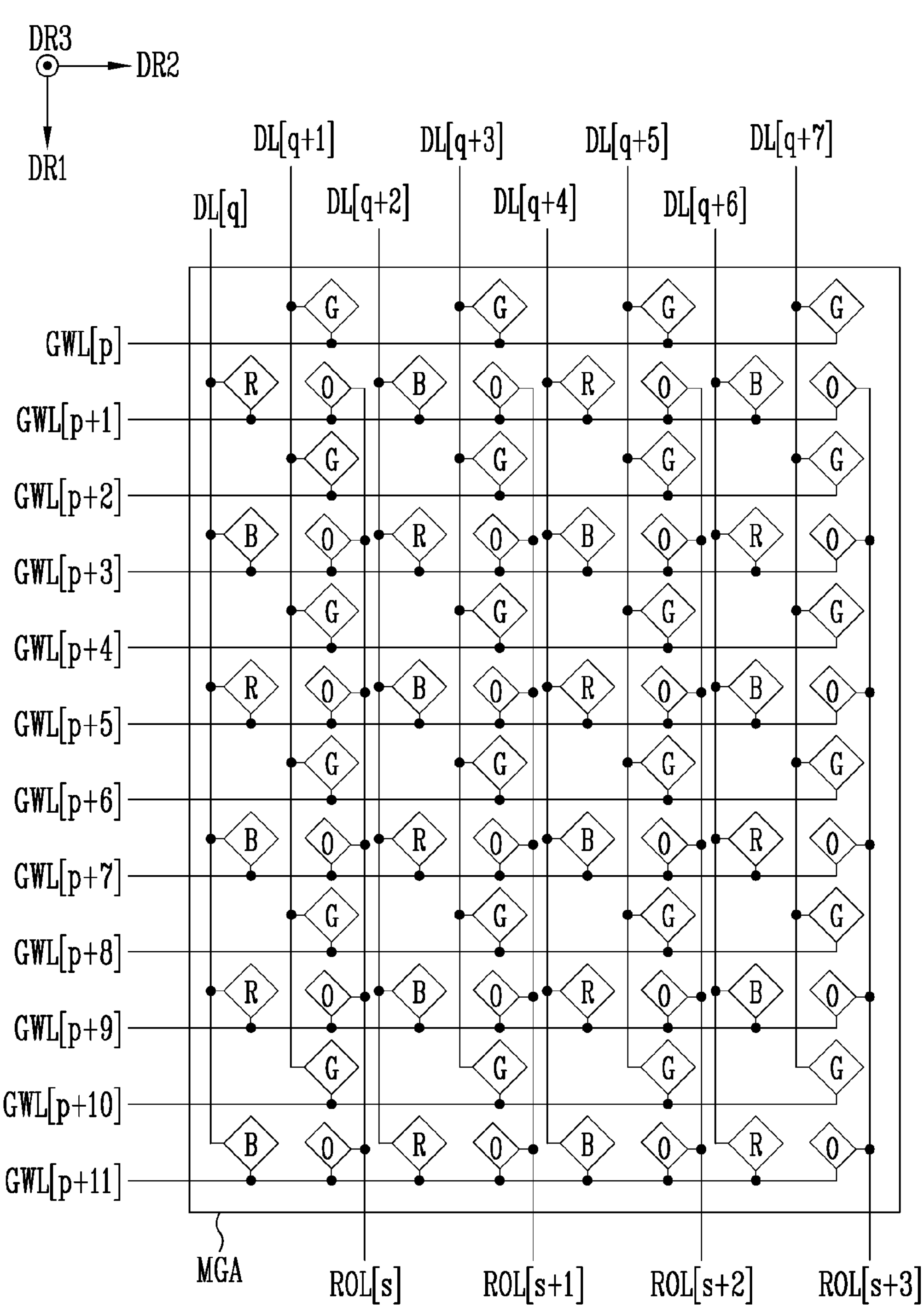
FIG. 6 is an enlarged view of a portion of the display panel of FIG. 5.

FIG. 6 is an enlarged view of a portion MGA of the display panel 10 of FIG. 5.

The pixels PX may be connected to first scan lines GWL[p] to GWL[p+11] and may include light emitting elements R, G, and B. The first scan lines GWL[p] to GWL[p+11] may be arranged in the first direction DR1. The first scan lines GWL[p] to GWL[p+11] may extend in the second direction DR2, where p may be an integer greater than 0. Also, the pixels PX may be connected to data lines DL[q] to DL[q+7]. The data lines DL[q] to DL[q+7] may extend in the first direction DR1 and may be arranged in the second direction DR2, where q may be an integer greater than 0.

Each of the light emitting elements R, G, and B of the pixels PX may emit light of one of a first color, a second color, and a third color. The first color, second color, and third color may be different colors. For example, the first color may be one of red, green, and blue, the second color may be one of red, green, and blue other than the first color, and the third color may be one of red, green, and blue other than the first and second colors. Also, magenta, cyan, and yellow may be used instead of red, green, and blue as the first to third colors.

In this embodiment, it is assumed that the light emitting elements R, G, and B of the pixels PX are arranged in a PENTILE™ structure, and the connection relationship between the first scan lines GWL[p] to GWL[p+11], the data lines DL[q] to DL[q+7] and the pixels PX is shown. For example, pixels PX including the light emitting elements R and B of the first color and the third color may be connected together to the same data line DL[q], DL[q+2], DL[q+4], or DL[q+6]), and pixels PX including the light emitting elements G of the second color may be individually connected to the data line DL[q+1], DL[q+3], DL[q+5], or DL[q+7]. Data lines DL[q], DL[q+2], DL[q+4], or DL[q+6]) connected to the pixels PX including the light emitting elements R and B of the first color and the third color and data lines DL[q+1], DL[q+3], DL[q+5], or DL[q+7] connected to the pixels PX including the light emitting elements G of the second color may be alternately arranged.

In addition, the pixels PX including the light emitting elements R and B of the first color and the third color may be connected together to the same first scan line GWL[p+1], GWL[p+3], GWL[p+5], GWL[p+7], GWL[p+9], or GWL[p+11]), and the pixels PX including the light emitting elements G of the second color may be individually connected to first scan line GWL[p], GWL[p+2], GWL[p+4], GWL[p+6], GWL[p+8], or GWL[p+10]. The first scan line GWL[p+1], GWL[p+3], GWL[p+5], GWL[p+7], GWL[p+9], or GWL[p+11] connected to the pixels PX including the light emitting elements R and B of the first color and the third color and the first scan line GWL[p], GWL[p+2], GWL[p+4], GWL[p+6], GWL[p+8], or GWL[p+10] connected to the pixels PX including the light emitting elements G of the second color may be alternately arranged.

In another embodiment, the light emitting elements R, G, and B of the pixels PX may be arranged in another structure such as an RGB stripe structure.

The optical sensors FX including light receiving elements O may be connected to the first scan lines GWL[p+1], GWL[p+3], GWL[p+5], GWL[p+7], GWL[p+9], or GWL[p+11]. For example, the optical sensors FX including the light receiving elements O, the pixels PX including the light emitting elements R of the first color, and the pixels PX including the light emitting elements B of the third color may be connected to the same first scan lines GWL[p+1], GWL[p+3], GWL[p+5], GWL[p+7], GWL[p+9], or GWL[p+11].

In an embodiment, the optical sensors FX are connected to a common reset line RSL (refer to FIG. 1). The optical sensors FX may be connected to corresponding readout lines ROL[s] to ROL[s+3]. The readout lines ROL[s] to ROL[s+3] may extend in the first direction DR1 and may be arranged in the second direction DR2.

Figure 7:
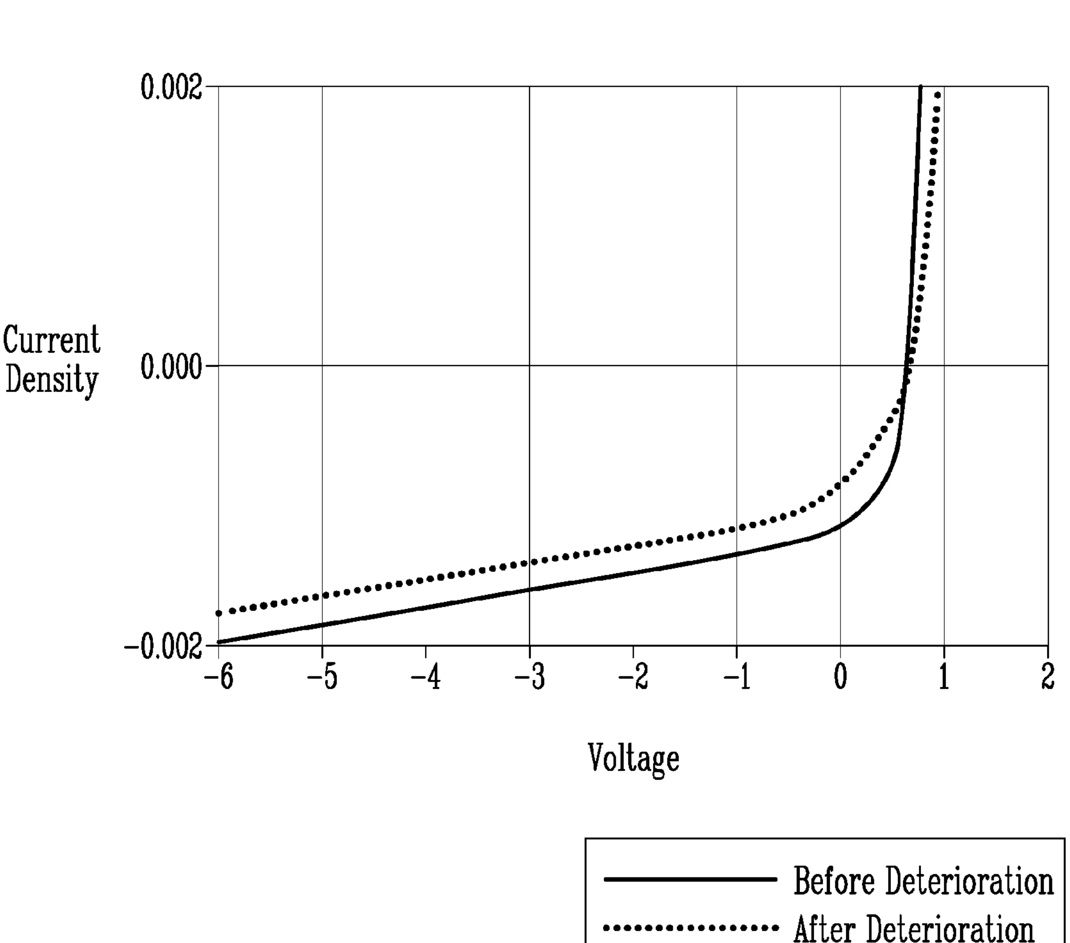
FIG. 7 is a graph illustrating voltage vs. current density before and after deterioration of a photodiode.

FIG. 7 is a graph illustrating voltage vs. current density before and after deterioration of a photodiode.

When the light receiving element PD of FIG. 3 is a photodiode, a voltage difference between both ends of the light receiving element PD may correspond to a horizontal axis in the graph. That is, a value obtained by subtracting a cathode voltage from an anode voltage of the light receiving element PD may correspond to the horizontal axis in the graph. Accordingly, when a voltage on the horizontal axis is a negative number, it may mean a state in which a reverse voltage is applied to the light receiving element PD. A unit of voltage may be volts (V).

When the voltage on the horizontal axis is applied to the light receiving element PD, a current having a current density on a vertical axis in the graph may flow. A direction of the current may be based on when it flows from the anode to the cathode of the light receiving element PD. That is, when the current density in the graph is a negative number, it may mean that current flows from the cathode to the anode of the light receiving element PD. A unit of the current density may be Milliamps per centimeter$^2$ (mA/cm$^2$).

In FIG. 7, it is assumed that the light receiving element PD is in a state of receiving light of 100 lux. When light is received in a state in which a reverse voltage is applied to the light receiving element PD, which is a photodiode, a photocurrent in a reverse direction may be generated. However, as the usage of the light receiving element PD increases, the light receiving element PD may deteriorate. In the deteriorated light receiving element PD, an absolute value of the current density of the photocurrent may decrease despite the same reverse voltage and the same light receiving amount.

Therefore, if the deterioration degree of the light receiving element PD is not properly compensated, the optical sensor FX cannot provide an appropriate sensing signal, and a fingerprint image derived from the sensing signal may be unclear, so that the function of authenticating a user may not be properly performed.

Figure 8:
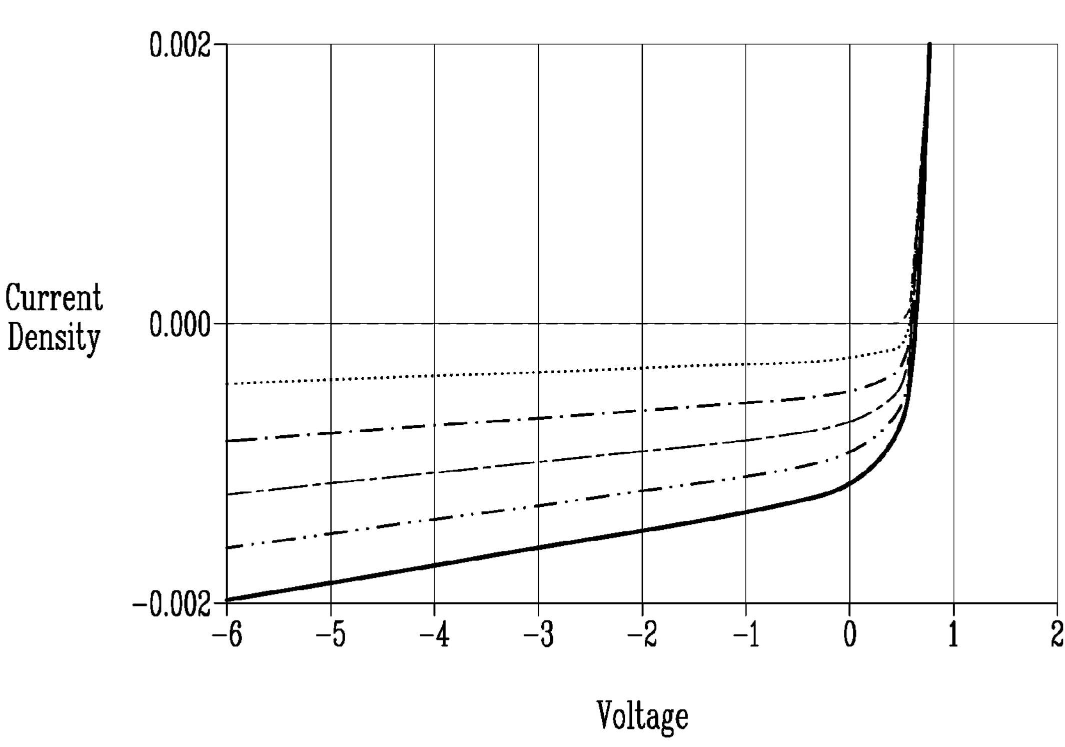
FIG. 8 is a graph illustrating voltage vs. current density according to the amount of light received by the photodiode.
Figure 8:
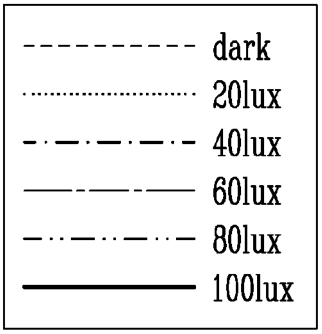

FIG. 8 is a graph illustrating voltage vs. current density according to the amount of light received by the photodiode.

Since the horizontal axis and the vertical axis in the graph of FIG. 8 are the same as those of FIG. 7, overlapping descriptions will be omitted. Referring to the graph of FIG. 8, it can be seen that the current density of the photocurrent increases as the amount of light received by the light receiving 10) element PD increases.

Figure 9:
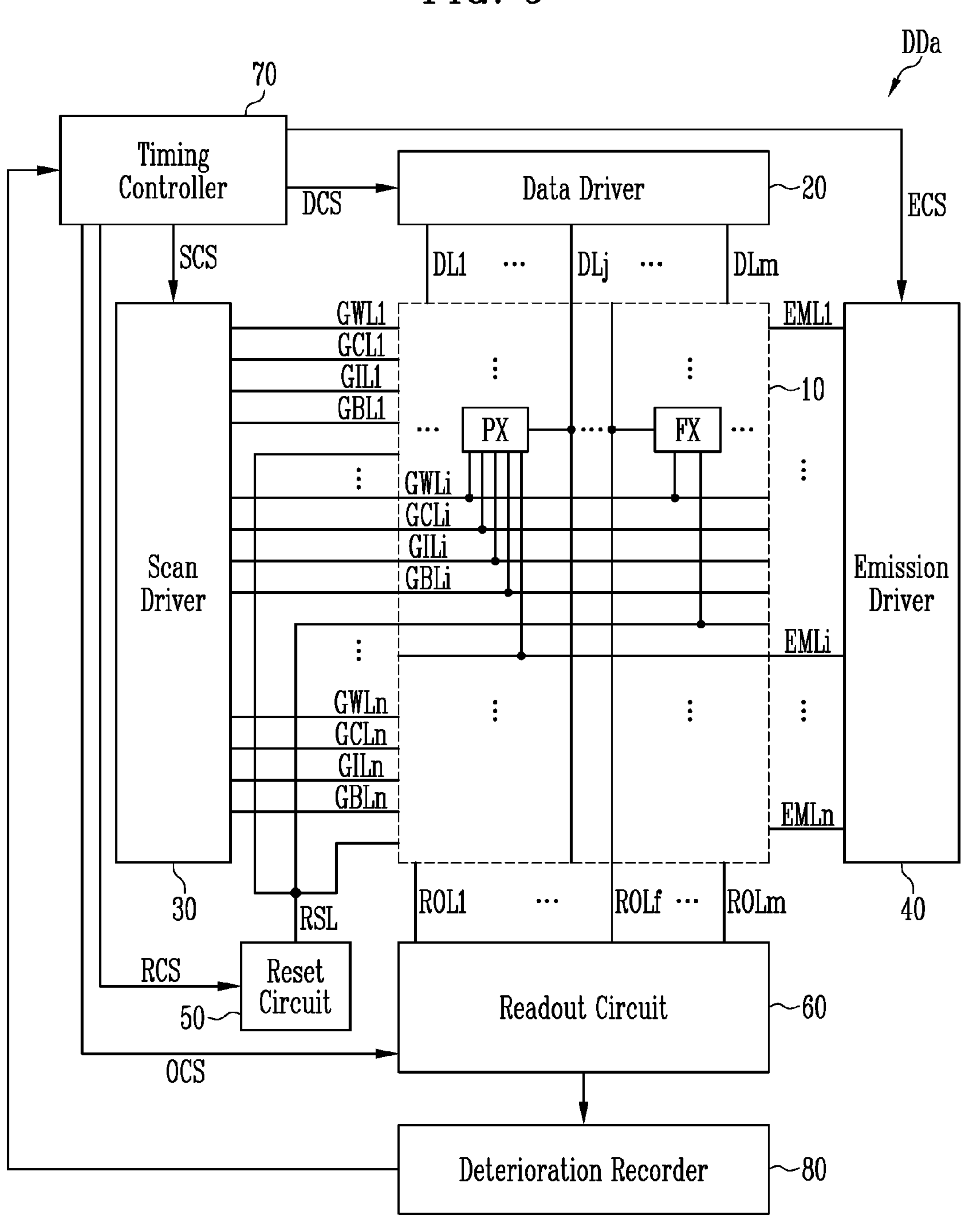
FIG. 9 is a diagram for explaining a display device according to an embodiment of the present invention.

FIG. 9 is a diagram for explaining a display device according to an embodiment of the present invention.

Referring to FIG. 9, a display device DDa according to an embodiment of the present invention includes a display panel 10, a data driver 20 (e.g., driver circuit), a scan driver 30 (e.g., driver circuit), an emission driver 40 (e.g., driver circuit), a reset circuit 50, a readout circuit 60, a timing controller 70 (e.g., controller circuit), and a deterioration recorder 80 (e.g., a recorder circuit). Descriptions of configurations overlapping those of the display device DD of FIG. 1 will be omitted. The deterioration recorder 80 may be connected to the readout circuit 60 and the timing controller 70.

In an embodiment, the deterioration recorder 80 updates deterioration degrees of the plurality of optical sensors FX based on the sensing signals. For example, the deterioration recorder 80 could store a previous deterioration degree of an optical sensor in a memory, determine a current deterioration degree of the optical sensor, and then update the stored deterioration degree to the current deterioration degree.

In an embodiment, the deterioration recorder 80 determines how much an optical sensor FX has deteriorated by comparing an input level of a sensing signal received from the optical sensor FX with a predetermined level. For example, no deterioration has occurred if the input level is greater than or equal to the predetermined level, and deterioration has occurred otherwise.

The deterioration degree may indicate how much an optical sensor FX has deteriorated. In an embodiment, the deterioration degree is the input level divided by the predetermined level when the input level is less than the predetermined level.

For example, the deterioration recorder 80 may increase the amount of light emitted by pixels located in an area of the optical sensors FX contributing to generating the fingerprint image when the sensing information generated from the readout circuit 60 indicates one or more of the optical sensors FX has deteriorated. The deterioration recorder 80 may maintain or increase the amount of light emitted by pixels in areas of the optical sensors FX that are unrelated or less relevant to fingerprint image generation by a relatively small amount even when the sensing information generated from the readout circuit 60 indicates one or more of the optical sensors FX has deteriorated. The deterioration recorder 80 may include memory elements for storing updated deterioration degrees.

Figure 10:
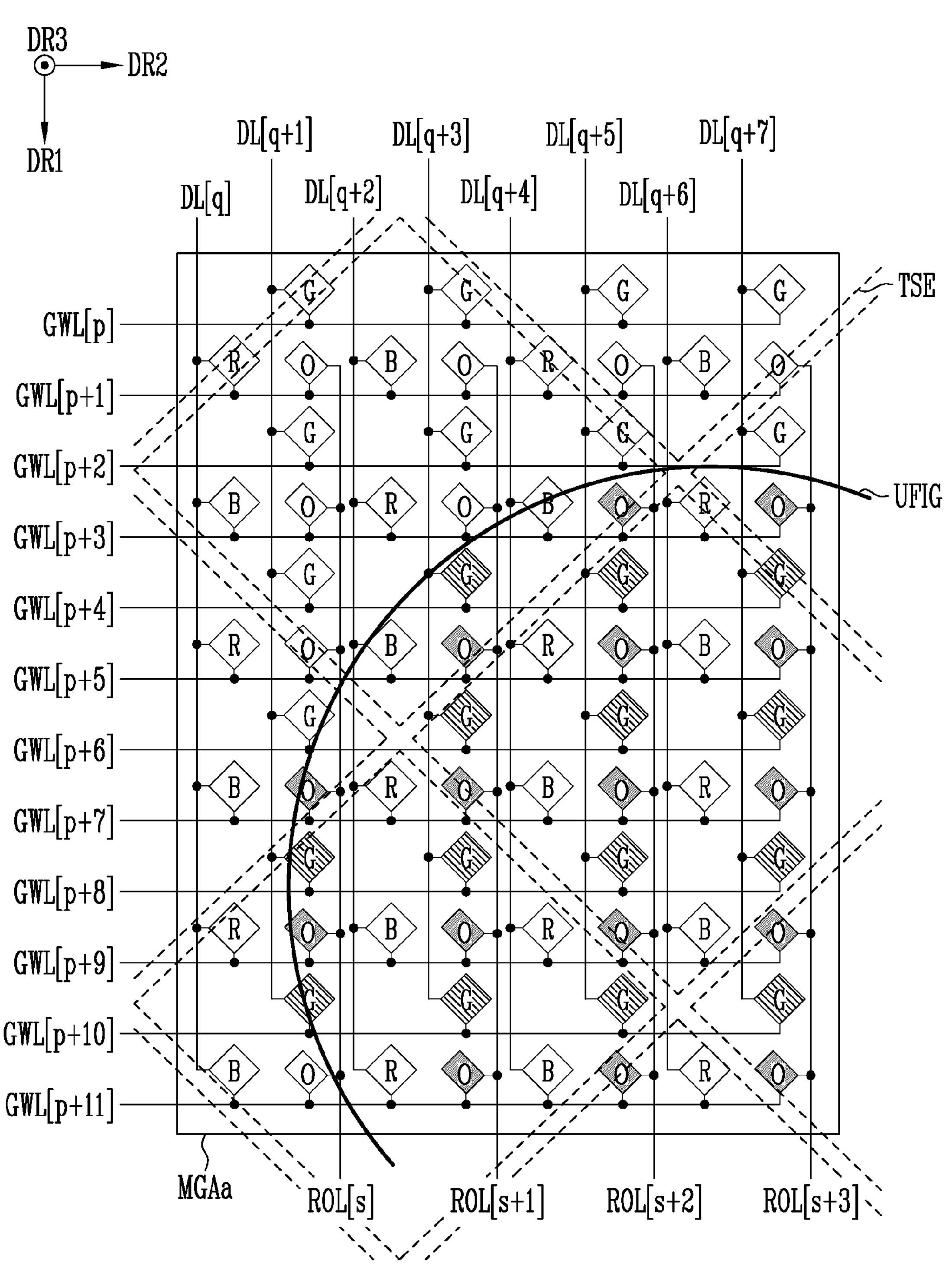
FIG. 10 is a diagram for explaining a driving method of the display device of FIG. 9.

FIG. 10 is a diagram for explaining a driving method of the display device of FIG. 9 according to an embodiment.

Since the configuration of a portion MGAa of the display panel 10 of FIG. 10 is the same as that of the portion MGA of the display panel 10 of FIG. 6, descriptions of overlapping configurations will be omitted.

Referring to FIG. 10, sensor electrodes TSE included in the touch sensor 11 are shown as an example. Since a user's finger is sufficiently large, an area of each of the sensor electrodes TSE may be manufactured to be larger than that of each of the pixels PX or photo sensors FX.

First, a partial area UFIG of the plurality of pixels PX may be selected. For example, a user's finger may touch the partial area UFIG. In this case, the touch sensor 11 may sense the selected area UFIG. For example, the touch sensor 11 may sense the area UFIG selected by a user by sensing a change in the capacitance of the sensor electrodes TSE.

Next, pixels PX located in the selected area UFIG may emit light in a sensing pattern. For example, the sensing pattern may be a single color pattern. Referring to FIG. 10, a pattern in which pixels PX including the light emitting elements G of the second color emit light is exemplified as the sensing pattern. In this embodiment, pixels PX including the light emitting elements R of the first color and the light emitting elements B of the third color are in a state of not emitting light. Meanwhile, in another example, the sensing pattern may be set so that only the light emitting elements R of the first color emit light. In an embodiment when the touch sensor 11 senses the selected area UFIG, the pixels within the selected area UFIG that are configured emit light of a single color among the available colored lights are set to emit light of the single color and the remaining pixels within the selected area UFIG are prevented from emitting light.

Meanwhile, when the partial area UFIG of the plurality of pixels PX is selected while the plurality of pixels PX displays an image, an image portion corresponding to the selected area UFIG may be changed to the sensing pattern, and the remaining image portion may maintain the image. For example, when a user selects and touches a specific icon on the display panel 10 displaying a plurality of icons, a portion covered by a finger may be the selected area UFIG, and only an image portion corresponding to the selected area UFIG may be changed to the sensing pattern. In this case, other image portions may maintain the image. Therefore, the user may perform the function of authenticating a user without visually recognizing the sensing pattern.

The optical sensors FX including the light receiving elements O within the selected area UFIG may generate a relatively large photocurrent by receiving reflected light of the sensing pattern reflected by the finger. On the other hand, the optical sensors FX including the light receiving elements O outside the selected area UFIG may generate relatively small photocurrent or no photocurrent by not receiving the reflected light.

The readout circuit 60 may receive the sensing signals corresponding to the photocurrents of the optical sensors FX through the readout lines ROL1 to ROLm, and may generate the sensing information corresponding to the fingerprint image based on the sensing signals. The processor or timing controller 70 may perform the function of authenticating a user by using the sensing information provided from the readout circuit 60.

In this embodiment, the display device DDa increases light emitting luminance of the sensing pattern as the deterioration degrees of the optical sensors FX located in the selected area UFIG among the plurality of optical sensors FX increases. For example, a circuit such as the deterioration recorder 80 or the timing controller 70 may perform this increase. In an embodiment, the circuit determines first amounts each of the optical sensors FX in the selected area UFIG have deteriorated during a first sensing period, determines a first deterioration degree of the sensing pattern based on the first amounts, and stores the first deterioration degree. The circuit sets the light emitting luminance of the sensing pattern to a first value based on the first deterioration degree. If the circuit determines during a second subsequent sensing period that the optical sensors FX have now reached a second deterioration degree higher than the first deterioration degree, the circuit sets the light emitting luminance of the sensing pattern to a second value higher than the first value.

Referring to FIG. 8, it can be seen that an absolute value of the current density of the light receiving element PD increases as the light emitting luminance increases. Therefore, by increasing the amount of light of the sensing pattern with reference to the deterioration degree of the light receiving element PD, the photocurrent reduced in comparison to the amount of light may be increased again. Accordingly, the display device DDA may accurately generate the fingerprint image and authenticate the user even when the deteriorated optical sensors FX are used.

Figure 11:
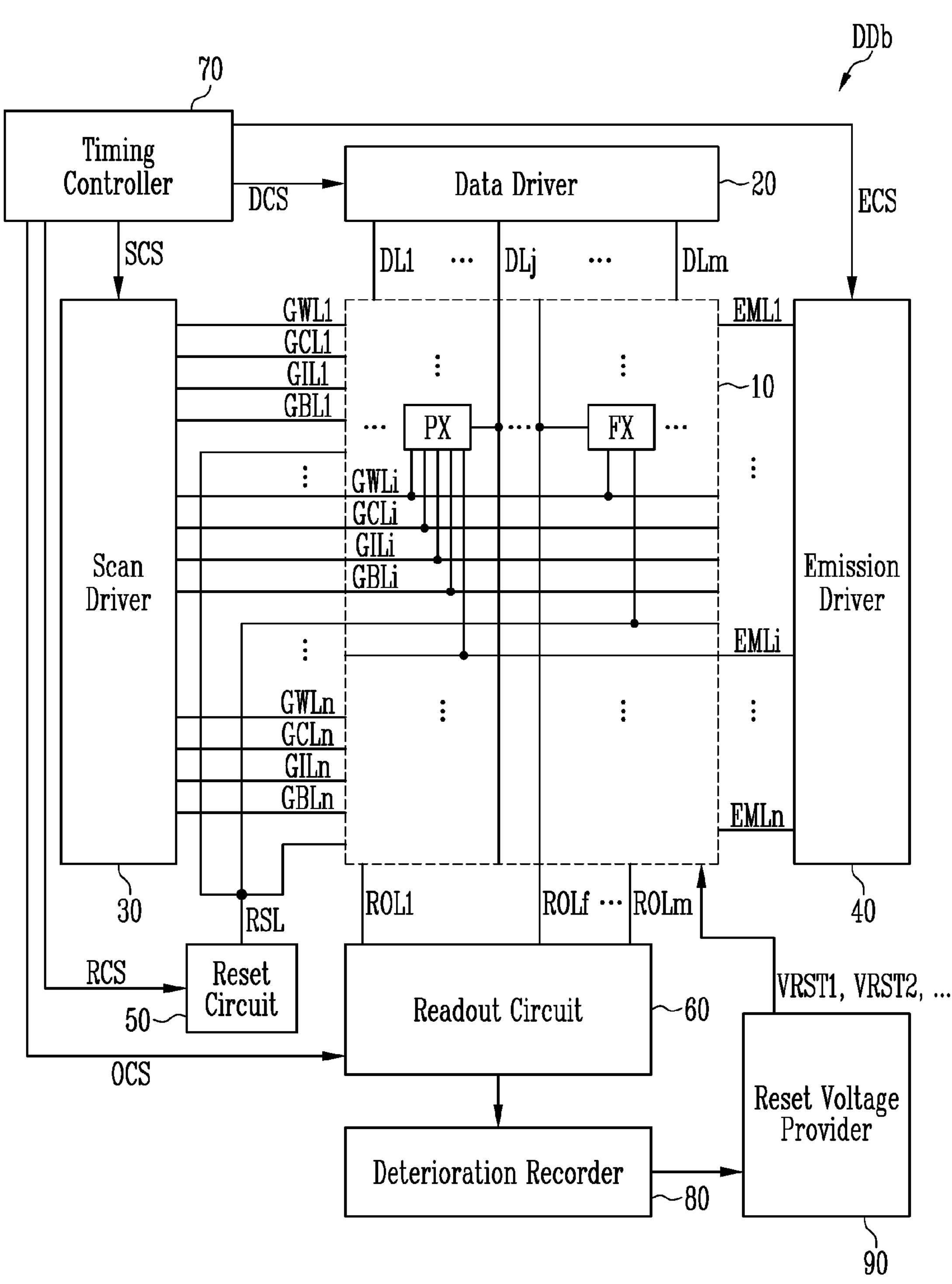
FIG. 11 is a diagram for explaining a display device according to an embodiment of the present invention.
Figure 12:
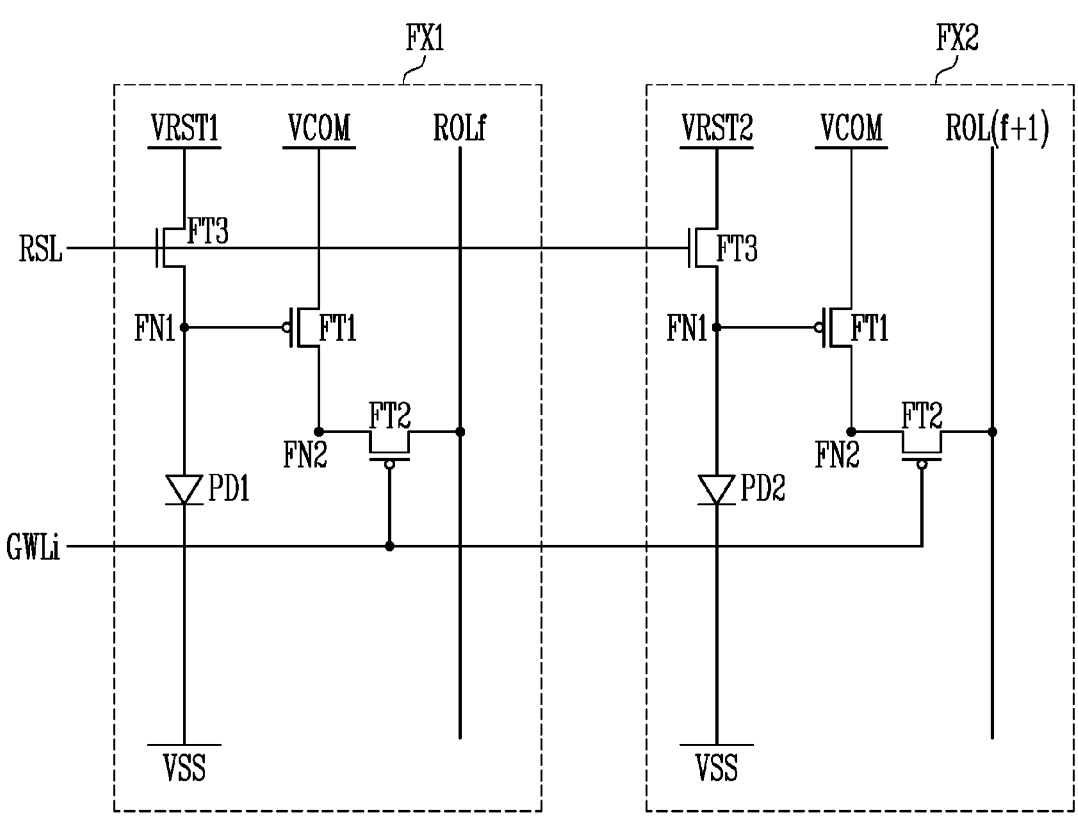
FIG. 12 is a diagram for explaining a first optical sensor and a second optical sensor in the embodiment of FIG. 11.

FIG. 11 is a diagram for explaining a display device according to an embodiment of the present invention. FIG. 12 is a diagram for explaining a first optical sensor and a second optical sensor in the embodiment of FIG. 11.

Referring to FIG. 11, a display device DDb according to an embodiment of the present invention includes a display panel 10, a data driver 20 (e.g., a driver circuit), a scan driver 30 (e.g., a driver circuit), an emission driver 40 (e.g., a driver circuit), a reset circuit 50, a readout circuit 60, a timing controller 70 (e.g., a controller circuit), a deterioration recorder 80 (e.g., a recorder circuit), and a reset voltage provider 90 (e.g., a voltage generator). Descriptions of configurations overlapping those of the display device DDA of FIG. 9 will be omitted.

A first optical sensor FX1 and a second optical sensor FX2 having different deterioration degrees will be described as an example. The first optical sensor FX1 and the second optical sensor FX2 may be connected to the same reset line RSL and the same first scan line GWLi. The first optical sensor FX1 may be connected to an f-th readout line ROLf and the second optical sensor FX2 may be connected to an (f+1)th readout line ROL(f+1). However, this is only an example, and this embodiment may be applied to two arbitrarily selected optical sensors FX.

Each of the plurality of optical sensors FX1 and FX2 may receive a reset voltage VRST1 or VRST2 corresponding to the deterioration degree, and apply the reset voltage VRST1 or VRST2 to an anode of a photodiode PD1 or PD2 during a reset period t1*a* to t2*a* (refer to FIG. 4). For example, the first optical sensor FX1 may include a first photodiode PD1 and apply a first reset voltage VRST1 to an anode of the first photodiode PD1 during the reset period t1*a* to t2*a*. The second optical sensor FX2 may include a second photodiode PD2 and apply a second reset voltage VRST2 to an anode of the second photodiode PD2 during the reset period t1*a* to t2*a*. The magnitude of the first reset voltage VRST1 and the magnitude of the second reset voltage VRST2 may be different from each other. In an embodiment, the reset period t1*a* to t2*a* of the first optical sensor FX1 and the reset period ta to t2*a* of the second optical sensor FX2 is the same.

The reset voltage provider 90 may provide a plurality of reset voltages VRST1 and VRST2 corresponding to the deterioration degrees. For example, when the deterioration degree of the first optical sensor FX1 is greater than that of the second optical sensor FX2, a difference between the first reset voltage VRST1 and a cathode voltage of the first photodiode PD1 may be set to be greater than a difference between the second reset voltage VRST2 and a cathode voltage of the second photodiode PD2. For example, when the same cathode voltage is applied to the photodiodes PD1 and PD2, the first reset voltage VRST1 may be lower than the second reset voltage VRST2.

Referring to FIG. 7, as the deterioration degree of the optical sensor FX increases, a lower reset voltage may be applied, so that a photocurrent having the same current density as the photocurrent before the optical sensor FX deteriorates may be generated. For example, the deterioration recorder 80 may output a control signal to the reset voltage provider 90 to control it output a proper reset voltage based on the deterioration degree of the optical sensor FX. In an embodiment, the deterioration recorder 80 informs the timing controller 90 of the deterioration degree and the timing controller 90 instructs the reset voltage provider 90 to output a proper reset voltage to compensate for the deterioration.

In applying the embodiments of FIGS. 11 and 12, the embodiment of FIGS. 9 and 10 for adjusting the light emitting luminance of the sensing pattern may also be applied together. That is, according to an embodiment, depending on the deterioration degree of the optical sensor FX, the light emitting luminance of the sensing pattern and the magnitude of the reset voltage may also be adjusted together.

According to the display device and the driving method thereof according to the present invention, the deterioration of the optical sensors can be compensated for.

The drawings referred to heretofore and the detailed description of the invention described above are merely illustrative of the invention. It is to be understood that the invention has been disclosed for illustrative purposes only and is not intended to limit the meaning or scope of the invention as set forth in the claims. Therefore, those skilled in the art will appreciate that various modifications and equivalent embodiments are possible without departing from the scope of the invention.

What is claimed is:

1. A display device comprising:

a plurality of pixels, in which pixels located in a selected partial area of a display area of the display device emit light in a sensing pattern, wherein pixels outside the selected partial area do not emit the sensing pattern;

a plurality of optical sensors generating sensing signals based on an amount of light received from the sensing pattern emitted by the pixels in the selected partial area; and a circuit determining amounts of deterioration of the plurality of optical sensors based on the sensing signals, wherein the circuit determines current deterioration degrees for the plurality of optical sensors located in the selected partial area and receiving reflected light from the sensing pattern based on the amounts, sets a light emitting luminance of the sensing pattern emitted by the pixels located in the selected partial area to a first value based on the current deterioration degrees, and the first value is larger than a second value associated with previous deterioration degrees of the optical sensors located in the selected partial area for the pixels in the partial area when the current deterioration degrees are greater than the previous deterioration degrees.

2. The display device of claim 1, wherein when the selected partial area of the plurality of pixels is selected while the plurality of pixels display an image, an image portion corresponding to the selected partial area is changed to the sensing pattern, and a remaining image portion maintains the image.

3. The display device of claim 1, further comprising:

a touch sensor sensing the selected partial area, wherein an area of a sensor electrode included in the touch sensor is larger than an area of one of the pixels or an area of one of the optical sensors.

4. The display device of claim 1, wherein the plurality of optical sensors comprise:

a first optical sensor including a first photodiode, wherein a first reset voltage is applied to an anode of the first photodiode during a reset period; and a second optical sensor including a second photodiode, wherein a second reset voltage is applied to an anode of the second photodiode during the reset period, wherein a magnitude of the first reset voltage and a magnitude of the second reset voltage are different from each other.

5. The display device of claim 4, wherein when a deterioration degree of the first optical sensor is greater than a deterioration degree of the second optical sensor, a difference between the first reset voltage and a cathode voltage of the first photodiode is set to be greater than a difference between the second reset voltage and a cathode voltage of the second photodiode.

6. The display device of claim 4, wherein the first optical sensor further comprises:

a first sensing transistor having a gate electrode connected to a first node, a first electrode connected to a common voltage line, and a second electrode connected to a second node;

a second sensing transistor having a gate electrode connected to a first scan line, a first electrode connected to the second node, and a second electrode connected to a readout line; and a third sensing transistor having a gate electrode connected to a reset line, a first electrode receiving the first reset voltage, and a second electrode connected to the first node.

7. The display device of claim 6, wherein some of the plurality of pixels are connected to the first scan line.

8. A display device comprising:

a plurality of pixels in which pixels located in a partial area of a display area of the display device emit light as a sensing pattern;

a plurality of optical sensors generating sensing signals based on an amount of light received from the sensing pattern emitted by the pixels in the partial area; and a circuit determining deterioration degrees of the plurality of optical sensors based on the sensing signals, wherein each of the plurality of optical sensors includes a photodiode, and wherein the circuit sets a reset voltage for each of the plurality of optical sensors in the partial area based on the corresponding deterioration degrees and applies each reset voltage to an anode of the photodiode of the corresponding optical sensors, during a reset period, and wherein the reset voltage applied to an optical sensor among the plurality of optical sensors decreases as a deterioration degree of the optical sensor increases.

9. The display device of claim 8, wherein the plurality of optical sensors comprise:

a first optical sensor including a first photodiode, and the circuit applies a first reset voltage to an anode of the first photodiode during the reset period; and a second optical sensor including a second photodiode, and the circuit applies a second reset voltage to an anode of the second photodiode during the reset period, wherein a magnitude of the first reset voltage and a magnitude of the second reset voltage are different from each other.

10. The display device of claim 9, wherein when a deterioration degree of the first optical sensor is greater than a deterioration degree of the second optical sensor, a difference between the first reset voltage and a cathode voltage of the first photodiode is set to be greater than a difference between the second reset voltage and a cathode voltage of the second photodiode.

11. The display device of claim 9, wherein the reset period of the first optical sensor and the reset period of the second optical sensor are the same.

12. The display device of claim 9, wherein the first optical sensor further comprises:

a first sensing transistor having a gate electrode connected to a first node, a first electrode connected to a common voltage line, and a second electrode connected to a second node;

a second sensing transistor having a gate electrode connected to a first scan line, a first electrode connected to the second node, and a second electrode connected to a readout line; and a third sensing transistor having a gate electrode connected to a reset line, a first electrode receiving the first reset voltage, and a second electrode connected to the first node.

13. The display device of claim 12, wherein some of the plurality of pixels are connected to the first scan line.

14. A method of driving a display device comprising:

selecting a partial area of a display area of the display device comprising a plurality of pixels;

controlling the pixels located in the selected partial area to emit light in a sensing pattern, wherein pixels outside the selected partial area do not emit the sensing pattern;

generating, by a plurality of optical sensors, sensing signals based on an amount of light received from the sensing pattern emitted by the pixels located in the selected partial area;

determining amounts of deterioration of the plurality of optical sensors based on the sensing signals;

determining current deterioration degrees for the plurality of optical sensors located in the selected area and receiving reflected light from the sensing pattern based on the amounts; and setting a light emitting luminance of the sensing pattern emitted by the pixels located in the selected partial area to a first value based on the current deterioration degrees, wherein the first value is larger than a second value associated with previous deterioration degrees of the optical sensors located in the selected partial area when the current deterioration degrees are greater than the previous deterioration degrees.

15. The method of claim 14, wherein when the partial area of the plurality of pixels is selected while the plurality of pixels display an image, an image portion corresponding to the selected area is changed to the sensing pattern, and a remaining image portion maintains the image.

16. A method of driving a display device comprising:

selecting a partial area of a display area of the display device comprising a plurality of pixels;

controlling the pixels located in the selected area to emit light in a sensing pattern;

generating, by a plurality of optical sensors, sensing signals based on an amount of light received from the sensing pattern emitted by the pixels in the selected area;

determining a deterioration degree for each of the plurality of optical sensors in the selected area based on the sensing signals, wherein each of the plurality of optical sensors includes a photodiode;

setting a reset voltage for each of the optical sensors in the selected area based on the corresponding deterioration degrees; and applying each reset voltage to an anode of the photodiode of the corresponding optical sensors, during a reset period, wherein the reset voltage applied to an optical sensor among the plurality of optical sensors decreases as a deterioration degree of the optical sensor increases.

17. The method of claim 16, wherein the plurality of optical sensors comprise:

a first optical sensor including a first photodiode, the method further comprising applying a first reset voltage to an anode of the first photodiode during the reset period; and a second optical sensor including a second photodiode, the method further comprising applying a second reset voltage to an anode of the second photodiode during the reset period, wherein a magnitude of the first reset voltage and a magnitude of the second reset voltage are different from each other.

18. The method of claim 17, wherein when a deterioration degree of the first optical sensor is greater than a deterioration degree of the second optical sensor, a difference between the first reset voltage and a cathode voltage of the first photodiode is set to be greater than a difference between the second reset voltage and a cathode voltage of the second photodiode.

19. The method of claim 17, wherein the reset period of the first optical sensor and the reset period of the second optical sensor are the same.

20. The method of claim 17, wherein the first optical sensor further comprises:

a first sensing transistor having a gate electrode connected to a first node, a first electrode connected to a common voltage line, and a second electrode connected to a second node;

a second sensing transistor having a gate electrode connected to a first scan line, a first electrode connected to the second node, and a second electrode connected to a readout line; and a third sensing transistor having a gate electrode connected to a reset line, a first electrode receiving the first reset voltage, and a second electrode connected to the first node.

* * * * *